United States Patent [19]

Verhaar et al.

[11] Patent Number: 5,358,902
[45] Date of Patent: Oct. 25, 1994

[54] METHOD OF PRODUCING CONDUCTIVE PILLARS IN SEMICONDUCTOR DEVICE

[75] Inventors: Robertus D. J. Verhaar; Leendert De Bruin, both of Eindhoven, Netherlands

[73] Assignee: U.S. Philips Corporation, New York, N.Y.

[21] Appl. No.: 165,556

[22] Filed: Dec. 10, 1993

Related U.S. Application Data

[63] Continuation of Ser. No. 946,043, Sep. 9, 1992, abandoned, which is a continuation of Ser. No. 727,290, Jul. 9, 1991, abandoned, which is a continuation of Ser. No. 513,692, Apr. 24, 1990, abandoned.

[30] Foreign Application Priority Data

Jun. 26, 1989 [GB] United Kingdom ............ 8914626.0

[51] Int. Cl.$^5$ ......................................... H01L 21/441
[52] U.S. Cl. ...................... 437/192; 437/41; 437/229
[58] Field of Search .......... 437/41, 43, 192, 194, 437/229; 148/DIG. 26

[56] References Cited

U.S. PATENT DOCUMENTS

| | | | |
|---|---|---|---|
| 4,434,544 | 3/1984 | Dohya et al. | 437/245 |
| 4,541,168 | 9/1985 | Galie et al. | 437/178 |
| 4,702,792 | 10/1987 | Chou et al. | 156/643 |
| 4,822,749 | 4/1989 | Flanner et al. | 437/41 |
| 4,866,008 | 9/1989 | Brighton et al. | 437/192 |
| 4,868,137 | 9/1989 | Kubota | 437/192 |
| 4,916,084 | 4/1990 | Shibata et al. | 437/192 |
| 5,063,169 | 11/1991 | De Bruin et al. | 437/192 |

FOREIGN PATENT DOCUMENTS 0195977 10/1986 European Pat. Off.

OTHER PUBLICATIONS

D. Day et al., "Origin and Prevention of High Contact Resistance in Multilevel Metal–Polyimide Structures", J. of Electronic Materials, vol. 11, No. 3, 1982, pp. 441–452.

S. Wolf, Silicon Processing for the VLSI Era, vol. 2, Lattice Press, Sunset Beach, Calif., 1990, pp. 214–217.

Wolf et al., Silicon Processing for the VSLI Era, Lattice Press, Sunset Beach, 1986 pp. 564–565.

Research Disclosure–275054–A, "Dual-dielectric Fabrication Method Using Polyimide Planarize Process" Mar. 10, 1987.

*Primary Examiner*—Tom Thomas
*Assistant Examiner*—Chandra Chaudhari
*Attorney, Agent, or Firm*—Norman N. Spain

[57] ABSTRACT

Electrical connection is provided to a device region (3,4) bounded by an insulating region (12a,12b,9) and adjacent one major surface (1a) of a semiconductor body (1) by applying a flowable organic material to form an organic layer (20) on the one major surface (1a), defining a masking layer (30) over the organic layer (20), etching the organic layer (20) selectively with respect to the underlying device and insulating regions through a window (31) in the masking layer (30) to form an opening (21) exposing a contact area (11) of the device region (3,4) and depositing electrically conductive material, for example tungsten, to form a conductive pillar (40) within the opening (21) in contact with the contact area (11). The organic layer (20) is then removed so as to expose the conductive pillar (40), a layer 50 of insulating material is provided over the pillar, the insulating layer is etched to expose a top surface of the pillar and electrically conductive material deposited to contact the pillar (40).

9 Claims, 3 Drawing Sheets

METHOD OF PRODUCING CONDUCTIVE PILLARS IN SEMICONDUCTOR DEVICE

This is a continuation of application Ser. No. 07/946,043, filed Sep. 9, 1992, now abandoned, which is a continuation of application Ser. No. 07/727,290, filed Jul. 9, 1991, now abandoned, which is a continuation of application Ser. No. 07/513,692, filed Apr. 24, 1990, now abandoned.

BACKGROUND OF THE INVENTION

The invention relates to a method of manufacturing a semiconductor device, which method comprises providing a semiconductor body having adjacent one major surface a device region bounded by an insulating region, providing electrical connection to the device region by applying a flowable organic material to form an organic layer on the one major surface, defining a masking layer over the organic layer, etching the organic layer selectively with respect to the underlying device and insulating regions through a window in the masking layer to form an opening exposing a contact area of the device region, and depositing electrically conductive material to form a conductive pillar within the opening in contact with the contact area.

Such a method is described in EP-A-0195977. As described in EP-A-0195977, the flowable material for forming the organic layer comprises a layer of polyimide which is spun onto the one major surface thus providing a relatively flat surface. An oxide layer is provided on the polyimide layer and is followed by a photosensitive resist which is developed to form the masking layer through which the organic layer is etched using a wet or a dry etchant. Tungsten is then selectively deposited to form the conductive pillar in the opening etched in the dielectric by chemical vapor deposition using $WF_6$ and $H_2$. A nucleation layer may be provided in the opening to facilitate tungsten deposition by using, for example, a lift-off technique. After formation of the conductive pillar a further layer of polyimide is spun onto the surface and the above-mentioned steps repeated. Where it is desired, as shown in FIG. 8 of EP-A-0195977, to interconnect two or more pillars by a second metallization level, then a nucleation layer will normally be required to enable selective deposition of tungsten over the first polyimide layer. This process may be repeated one or more further times depending on the desired number of metallization levels. This method relies on the spun-on polyimide layers to provide the insulating or dielectric material which isolates conductive pillars from one another so that only the desired electrical connections are made. Polyimide is, however, susceptible to cracking and contamination and therefore may not provide sufficiently good insulation so that short-circuits may, for example, occur.

SUMMARY OF THE INVENTION

It is an object of the present invention to provide a method of manufacturing a semiconductor device which enables the formation of good electrical connection to a device region while avoiding or at least reducing the above-mentioned problems.

According to the present invention, there is provided a method of manufacturing a semiconductor device, which method comprises providing a semiconductor body having adjacent to one major surface a device region bounded by an insulating region, providing electrical connection to the device region by applying a flowable organic material to form an organic layer on the one major surface, defining a masking layer over the organic layer, etching the organic layer selectively with respect to the underlying device and insulating regions through a window in the masking layer to form an opening exposing a contact area of the device region, and depositing electrically conductive material to form within the opening a conductive pillar contacting the contact area, characterised by removing the organic layer so as to expose the conductive pillar, providing a layer of insulating material to cover the pillar, etching the insulating layer to expose a top surface of the pillar and depositing electrically conductive material to contact the pillar.

DETAILED DESCRIPTION OF THE INVENTION

Figure 1:
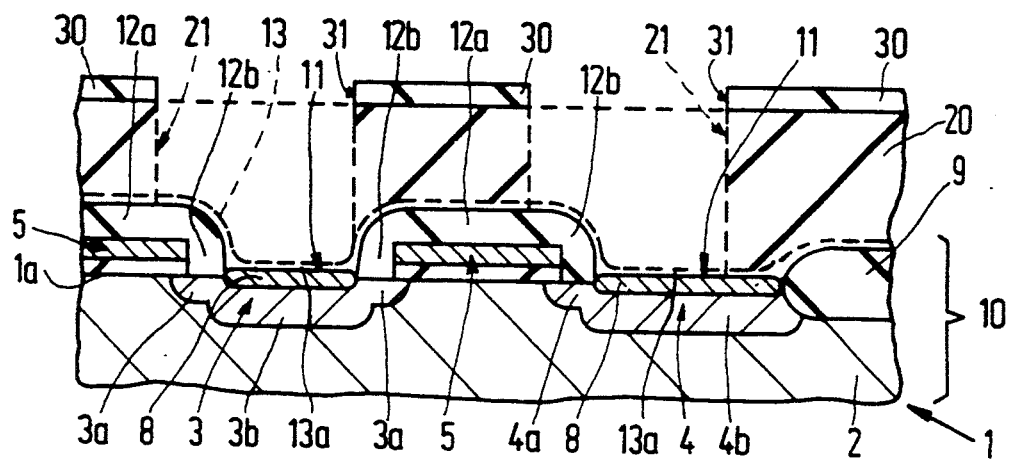
FIGS. 1 to 5 are cross-sectional views of part of a semiconductor device illustrating a first embodiment of the method of the invention and FIG. 6 is a cross-sectional view of part of a semiconductor device illustrating a second embodiment of the method of the invention.
Figure 2:
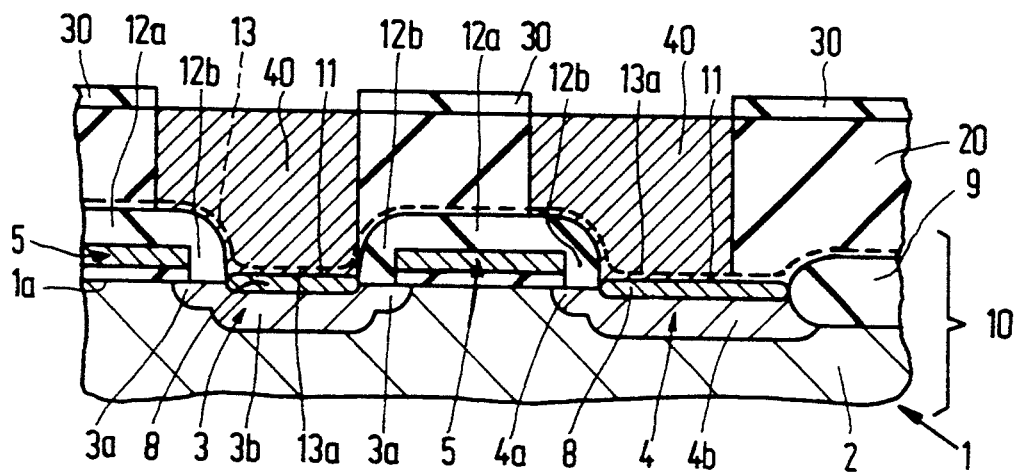

It should be understood that, as used herein, the term 'flowable organic material' means any suitable carbon-containing polymer which can be etched easily by, for example, an oxygen-containing plasma.

Using a method embodying the invention enables the advantages of using a flowable organic material such as polyimide to be obtained, namely that the application of a flowable organic insulating material enables the contact hole or opening to be etched with a high (usually almost infinite) selectivity with respect to the underlying device and insulating regions. Thus very little, if any, of the underlying material is removed by the etching of the opening or contact hole enabling the contact hole or opening to overlap onto gate isolation or field oxide without risk of undesired short-circuits between, for example, an insulated gate and a device region being contacted by the pillar, while avoiding or at least reducing the problems of cracking and/or contamination which may occur when a flowable material such as polyimide is used as an insulating layer.

Furthermore, using a method embodying the invention reduces potential alignment problems because the electrically conductive material for contacting the conductive pillar is deposited directly onto the pillar, and then may be patterned as desired, thus ensuring good electrical contact with the pillar.

A nucleation layer, such as a layer of amorphous silicon or a titanium-tungsten alloy where the semiconductor device is a silicon device and the selectively deposited conductive material is tungsten, may be provided on the one major surface prior to applying the flowable organic material to facilitate growth of the conductive pillar on the contact area, irrespective of the material originally present at the contact area, and without an increased risk of undesired electrical short-circuits because exposed portions of the nucleation layer may be removed after removal of the organic layer.

Generally, in a method embodying the invention, the masking layer may be a layer of a material selected from the group consisting of silicon oxide, silicon nitride and borophosphosilicate glass and spin-on-glass and the organic layer is etched through the masking layer using a reactive ion etching process enabling the opening exposing the contact area to be precisely defined and to have straight side walls, which features are particularly important for very large scale integration where the opening or contact hole may be less than a micrometer in width or diameter.

The insulating layer may be provided by depositing a layer of silicon oxide, applying a resist layer on the silicon oxide layer to provide a flatter surface and then etching the further layer so that the silicon oxide and resist are etched at the same rate thereby providing a relatively flat surface upon exposure of the top surface of the conductive pillar, thus enabling the formation of a relatively flat insulating layer from an insulating material having good insulating properties which is less susceptible to contamination and cracking than a flowable organic material such as polyimide.

Embodiments of the invention will now be described, by way of example, with reference to the accompanying drawings.

It should be understood that the Figures are merely schematic and are not drawn to scale. In particular certain dimensions such as the thickness of layers or regions may have been exaggerated while other dimensions may have been reduced. It should also be understood that the same reference numerals are used throughout the Figures to indicate the same or similar parts.

Referring now to the drawings, specifically FIGS. 1 to 5, there is illustrated a method of manufacturing a semiconductor device, which method comprises providing a semiconductor body 1 having adjacent to one major surface 1a a device region 3,4 bounded by an insulating region 9,12a,12b, providing electrical connection to the device region by applying a flowable organic material to form an organic layer 20 on the one major surface 1a, forming a masking layer 30 over the organic layer 20, etching the organic layer 20 selectively with respect to the underlying device and insulating regions through a window 31 in the masking layer 30 to form an opening 21 exposing a contact area 11 of the device region 3,4 and depositing electrically conductive material, for example tungsten, to form a conductive pillar 40 (FIG. 2) within the opening 21 in contact with the contact area 11.

Figure 3:
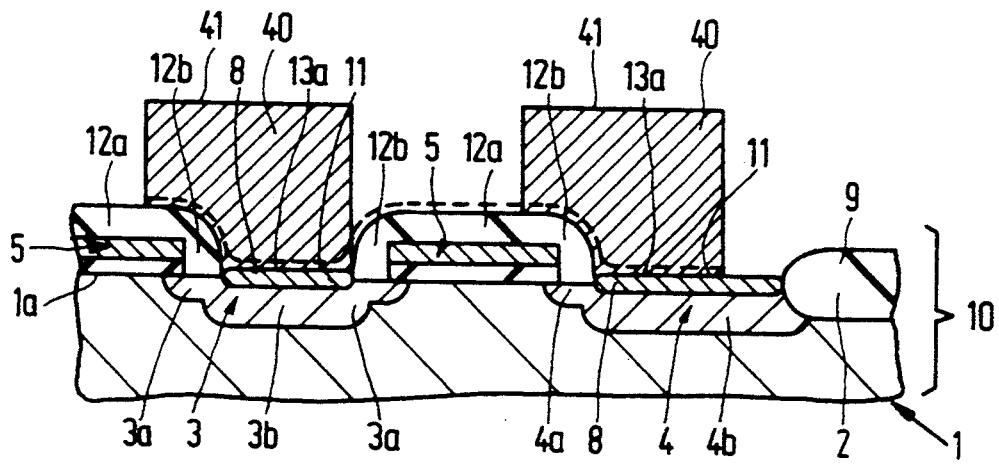
Figure 4:
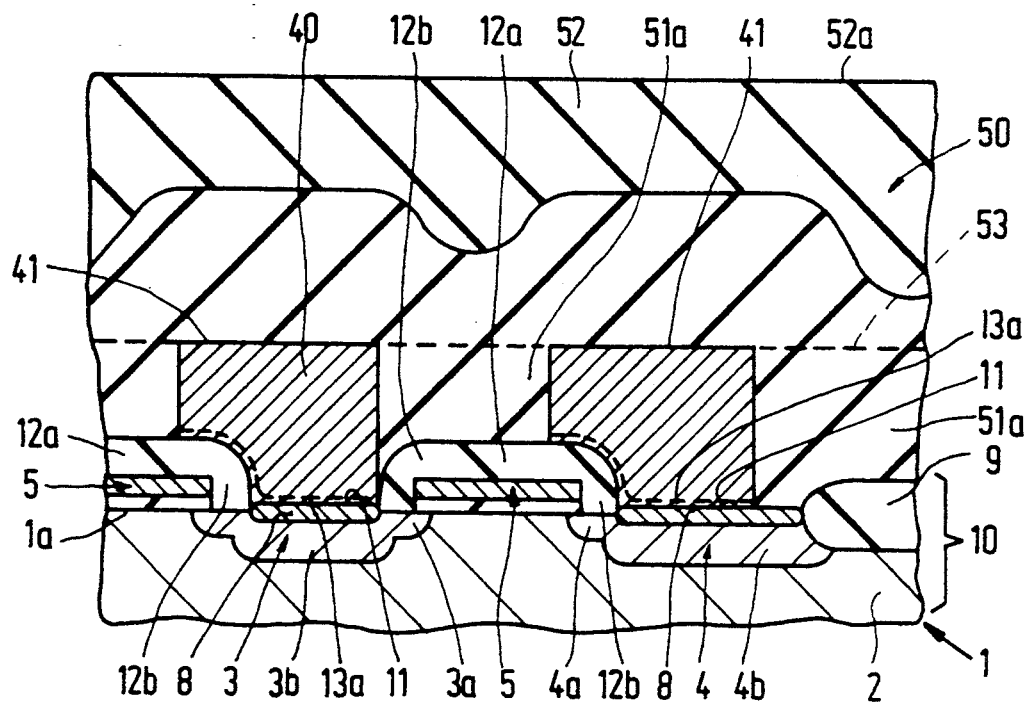
Figure 5:
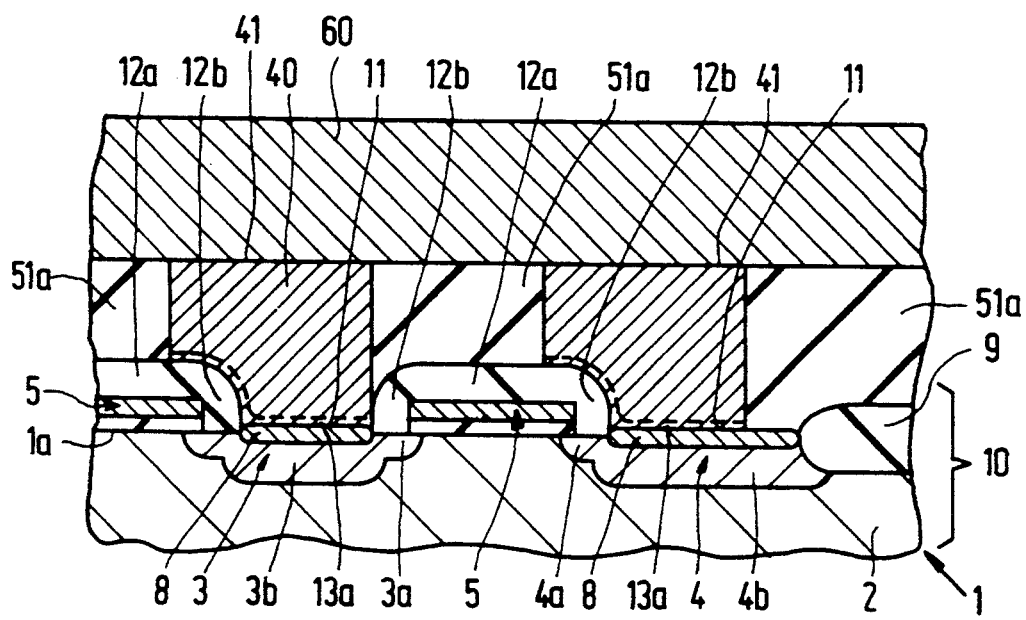

In accordance with the invention, the method further comprises, as shown in FIGS. 3, 4 and 5 removing the organic layer 20 so as to expose the conductive pillar 40, providing a layer 50 of insulating material over the pillar 40, etching the insulating layer to expose a top surface 41 of the pillar and depositing electrically conductive material 60 to contact the pillar 40.

Using a method embodying the invention enables the advantages of using a flowable organic material such as polyimide to be obtained, namely the fact that the application of a flowable organic material enables the contact hole or opening 21 to be etched with a high selectivity (in practice almost infinite selectivity) so that very little, if any, of the material comprising the underlying device and insulating regions is removed by the etching of the opening or contact hole 21, while avoiding or at least reducing the problems of cracking and/or contamination which may occur when a flowable material such as polyimide is used as an insulating layer.

Turning now specifically to FIG. 1, the semiconductor device comprises a monocrystalline silicon semiconductor body 1 having adjacent one major surface 1a of the semiconductor body 1 a relatively lowly doped region 2 of the one conductivity type, in this example p-conductivity type, within which more highly doped device regions 3,4 of the opposite conductivity type, in this example n-conductivity type, are provided adjacent to the one surface 1a. Although only two device regions 3,4 are shown in FIG. 1, it will be appreciated that the semiconductor body 1 will have many such device regions provided therein. In this example, the device regions 3,4 are associated with insulated gate structures 5 provided on the one surface 1a to form insulated gate field effect transistors (IGFETs). The device regions 3,4 mentioned above, being of n-conductivity type form n-channel IGFETs. However, as will be appreciated by those skilled in the art, the semiconductor body may also contain p-channel IGFETs, so as to form a CMOS integrated circuit, with the p-channel IGFETs being formed by p-conductivity type device regions provided within an n-conductivity type well and, of course, associated insulated gates.

The devices described above are formed in the semiconductor body 1 by, after formation of a field oxide pattern (part of an insulating region 9 of which is shown in FIG. 1) by conventional local oxidation of silicon (LOCOS) techniques, forming the insulated gates 5 in a conventional manner by growing a gate oxide layer on the surface 1a and then providing a doped polycrystalline silicon layer on the gate oxide layer. The doped polycrystalline silicon layer is locally capped by an insulating region 12a of, for example, silicon oxide and-/or silicon nitride. After patterning by conventional photolithographic and etching techniques to define the insulated gates 5, low doped extension regions 3a,4a of the device regions 3,4 are formed in self-aligned manner using the insulated gates 5 and the field oxide pattern 9 as a mask.

A silicon oxide or silicon nitride layer 12 is then deposited by a conventional chemical vapor deposition technique and etched using a suitable known anisotropic etching process to provide, as shown in FIG. 1, insulating spacer regions 12b on the side walls of the insulated gates 5 which together with the insulating capping regions 12a encapsulate the insulated gates 5 to avoid undesired shorting between the insulated gates 5 and the device regions 3,4 by subsequent metallization, and to expose the contact areas 11 of the device regions 3,4. The insulated gates 5 shown in FIG. 1 are both encapsulated by local insulating capping regions 12a and insulating spacer regions 12b. However, other insulated gates (not shown) of the device may not be provided with an insulating capping region 12a.

After formation of the insulating spacer regions 12b, more highly doped regions 3b, 4b of the device regions 3,4 are formed in conventional self-aligned manner using the insulated gates 5, spacer regions 12b and field oxide insulating region 9 as a mask.

In order to improve ohmic contact to the device regions 3,4, silicide regions 8, for example a titanium or cobalt silicide, may be formed at the surfaces of the device regions 3,4 in known manner by depositing a titanium or cobalt layer on the exposed silicon surfaces and heating.

The above-described structure shown in FIG. 1 constitutes a substructure 10 to which, in this example, electrical connection is to be made.

The flowable organic material is then spun onto the one major surface 1a as, in this example, a layer 20 of polyimide to an average thickness which is of course determined by the surface structure. In this example, where the pitch is about 1.2 micrometers, the width of the insulated gates 5 is about 0.55 micrometers and the height of the step defined by the insulated gates 5 and covering insulating capping regions 12a is about 0.5 micrometers (the insulating capping regions 12a being about 0.2 micrometers thick), then the polyimide may have a thickness of about 0.7 micrometers. The polyimide layer 20 is cured for, for example, about 30 minutes at 400°.

The masking layer 30 is thus deposited at a low temperature. The masking layer 30 may be a low temperature oxide, a low temperature borophosphosilicate glass or a silicon oxide or silicon nitride formed by a conventional low temperatures, at about 300°-350° C., plasma enhanced chemical vapor deposition process. Alternatively, a spin-on-glass may be used to form the masking layer 30.

The masking layer 30 is patterned using conventional photolithographic and fluorine-based dry etching techniques to provide the windows 31 over the contact areas 11 (two of which are shown in the Figures).

As indicated by the phantom lines in FIG. 1, the polyimide first insulating layer 20 exposed through the windows 31 is then etched by a suitable anisotropic etching process to form the openings 21 exposing the contact areas 11. In this example, a reactive ion etching process is used which employs an oxygen plasma with a small quantity of fluorine added to enhance the etch rate and prevent, or at least reduce, polymer residues. The amount of fluorine used is adjusted in such a way as to maintain a good etch selectivity of the organic layer 20 with respect to the masking layer 30.

Conductive pillars 40 are then formed by filling the openings 21 with tungsten using a selective process which causes the tungsten to be deposited on the exposed silicon or silicide surface regions but not on the masking layer 30. The tungsten may be deposited by a suitable chemical vapor deposition process using $WF_6$ and $H_2$, for example as described in EP-A-0195977, or $WF_6$ with silane.

Alternatively, a non-selective or blanket deposition process may be used and the deposited tungsten layer then etched back to expose the organic layer 20 leaving the conductive pillars 40 in the openings 21. This has the advantage that a more uniform pillar shape may be obtained without the formation of so-called "nailheads" characteristic of selective deposition. Of course, conductive materials other than tungsten may be used to form the conductive pillars 40.

In order to obtain growth of the tungsten pillar on the surface of the insulating spacer regions 12b, a nucleation layer 13 (shown in phantom lines in the Figures), for example a layer of amorphous silicon or a titanium-tungsten alloy, may be deposited on the substructure 10 prior to the application of the flowable organic layer 20. Such a nucleation layer also facilitates adhesion of the tungsten to the contact area 11.

The use of a flowable organic material such as polyimide to form the layer 20 means that the surface of the organic layer is relatively flat or planar and that moreover the conductive pillars 40, if formed by a blanket deposition technique, will have top surfaces 41 which lie on a relatively flat surface. However, polyimide is susceptible to cracking and also to contamination and therefore may not form a sufficiently good insulating layer. Accordingly, after selective deposition of the tungsten to form the conductive pillars 40, the organic layer 20 and the masking layer 30 are removed using, for example, wet chemical etching with HF solutions or plasma etching in a fluorine environment to remove the masking layer 30 and, for example, an oxygen plasma etching process or a wet chemical etching process using $HNO_3$, $H_2N_2$ to remove the polyimide layer 20. This has the advantage that the polyimide may be removed with high selectivity relative to the tungsten pillars 40 and oxide.

Where the nucleation or adhesion layer 13 is provided then the exposed portions of the layer 13 are removed, by conventional means, after removal of the polyimide layer 20. The removal of the polyimide layer 20 thus enables the use of a nucleation layer 13 which extends (as shown in phantom lines in FIGS. 1 and 2) over the entire surface and in particular onto the insulating spacer regions 12a, and caps insulating regions 12b and field oxide insulating regions 9. This enables the growth of tungsten over insulating material such as silicon oxide thereby allowing the conductive pillars 40 to overlap adjacent insulating material without causing short-circuits which might otherwise arise if the polyimide layer 20, and thus necessarily the nucleation layer 13, were to remain in place after formation of the conductive pillars 40. FIG. 3 shows the structure after removal of the polyimide first insulating layer 20 with the remaining portions 13a of the nucleation layer beneath the conductive pillars 40.

As shown in FIG. 4, the additional insulating layer 50 is then provided so as to cover the entire structure on the one major surface 1a. In this example, the additional insulating layer 50 is formed by first depositing a layer 51 of insulating material, for example using tetraethyl orthosilicate (TEOS), which follows the contours of the surface and then applying a photosensitive resist layer 52 which, being a flowable material, provides a relatively flat surface 52a. The additional insulating layer 50 is then etched back using an etchant, such as a $CF_4/O_2$ plasma, which etches the photosensitive resist and the silicon oxide layer at substantially the same rate until the top surfaces 41 of the pillars 40 are exposed. The dashed line 53 in FIG. 4 illustrates the surface of the additional insulating layer 50 after this etch-back process. The etch-back process thus completely removes the photosensitive resist layer 52 and leaves a relatively flat surface in which the conductive pillars 40 are bounded and isolated by the remaining portions 51a of the insulating layer 51 so that a relatively flat surface is provided while avoiding or at least reducing the cracking and contamination problems which may arise when polyimide is used as the insulating material. Electrically conductive material 60, for example aluminum, is then deposited so as to contact the conductive pillars 40. The electrically conductive material 60 may then be patterned using conventional photolithographic and etching processes to provide the desired electrical connections between conductive pillars.

Figure 6:
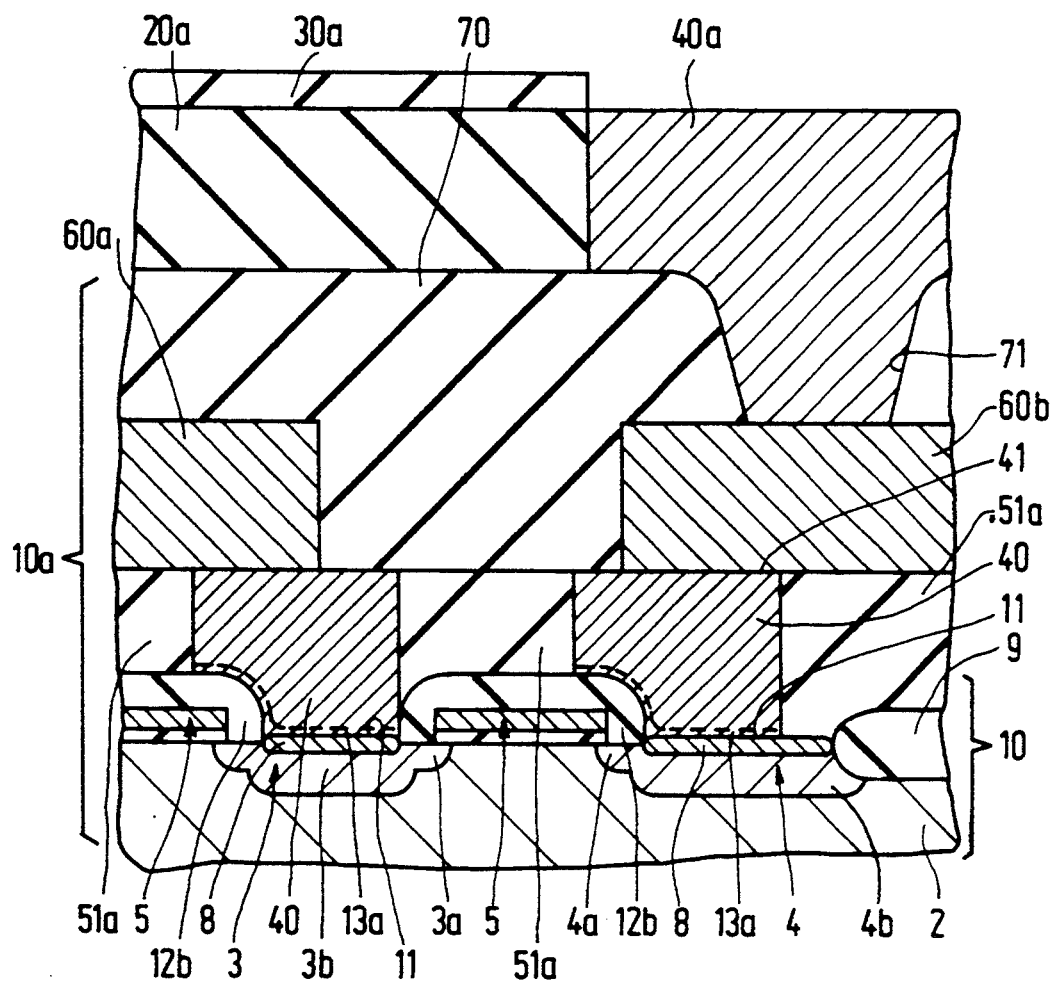

FIG. 6 shows an arrangement in which the electrically conductive material 60 has been patterned to define separate conductive tracks 60a,60b contacting the two conductive pillars 40 shown in the Figures. Such an arrangement may, for example, be appropriate when the device regions 3 and 4 shown in the Figures form the source and drain regions of the same IGFET.

As shown in FIG. 6, the metallization level 60 may be covered by another insulating layer, for example a silicon oxide layer 70 deposited by chemical vapor deposition which is subsequently patterned to define openings 71 (only one is shown) through which a further metallization level (not shown) is to contact the metallization level 60. The method described above with reference to FIGS. 1 to 5 may then be used to enable electrical connection between desired conductive tracks of the two metallization levels so that, as shown in FIG. 6, a further polyimide layer 20a and covering masking layer 30a are provided on the surface of the other insulating layer 70 and a conductive pillar 40a is formed within the opening 71. The method then proceeds as described above with reference to FIGS. 3 to 5 but with the substructure 10 shown in FIGS. 1 to 5 replaced by the substructure 10a shown in FIG. 6. The method may be repeated for further metallization levels.

The use of the organic layer 20 enables the openings or contact holes 21 to be etched with very high selectivity (in practice effectively infinite selectivity) with respect to the underlying device regions 3,4 and insulating regions 12a,12b,9 so that very little of the underlying material is etched during formation of the contact holes or openings 21. The nucleation layer 13 can be provided beneath the organic layer 20 to enable growth of the conductive pillar 40 on adjacent insulating material because exposed portions of the nucleation layer 13 can be removed after removal of the organic layer 20 thereby avoiding possible short-circuits. Thus, because the process used to open the contact holes 21 does not attack underlying device regions and gate or field isolation and growth of the conductive material on insulating material is facilitated, the conductive pillars 40 can extend or overlap onto adjacent field oxide insulating regions 9 or insulating regions 12a, 12b without risk of undesired shorting of, for example, a device region 3,4 contacted by a pillar 40 to, for example, an insulated gate 5 or a connecting conductive strap (not shown) on the field oxide 9. The method is thus more tolerant of misalignment of the contact holes or openings 21 than conventional methods.

From reading the present disclosure, other modifications will be apparent to persons skilled in the semiconductor art and which may be used instead of or in addition to features already described herein. Although claims have been formulated in this application to particular combinations of features, it should be understood that,the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention.

I claim:

1. A method of manufacturing a semiconductor device, which method comprises providing an organic polymer layer on a major surface of a semiconductor body, which major surface has adjacent thereto a device region bounded by an insulating region also adjacent to said major surface, by applying a layer of a flowable carbon-containing organic polymer, easily etchable in a plasma containing mostly oxygen, on said major surface, providing a masking layer over and in contact with the layer of the organic polymer, etching the layer of the organic polymer selectively with respect to the underlying device region and insulating region through a window in the masking layer with said plasma to form an opening exposing a contact area of a device region, depositing electrically conducting material in the opening to form a conductive pillar contacting the contact area, removing the remaining portions of the layer of the organic polymer thereby to expose side surfaces of said pillar, providing a layer of insulating material other than the layer of organic polymer to contact and to cover the pillar, etching the layer of insulating material to expose a top surface of the pillar and depositing electrically conductive material to contact the pillar.

2. A method according to claim 1, comprising using polyimide as the flowable carbon-containing organic polymer material.

3. A method according to claim 2, comprising in that providing the masking layer is from a material selected from the group consisting of silicon oxide, silicon nitride borophosphosilicate glass and spin-on-glass and the organic polymer layer is etched through the masking layer by using a reactive ion etching process.

4. A method according to claim 1, further comprising selectively depositing tungsten to form the conductive pillar.

5. A method according to claim 1 further comprising providing the layer of insulating material by depositing a layer of silicon oxide, applying a resist layer on the silicon oxide layer to form a flatter surface and then etching the silicon oxide layer and the resist layer at the same rate thereby providing a relatively flat surface upon exposure of the top surface of the conductive pillar.

6. A method according to claim 1 wherein the conductive pillar is formed by depositing a layer of tungsten on said layer of organic polymer and in said opening after formation of said opening, and then etching said tungsten layer to expose said layer of organic polymer while leaving said tungsten layer in said opening thereby forming said conductive pillar.

7. A method of manufacturing a semiconductor device, which method comprises providing a nucleation layer on a major surface of a semiconductor body, which major surface has adjacent thereto a device region bounded by an insulating region also adjacent to said major surface, applying a layer of a flowable carbon-containing organic polymer easily etchable in a plasma containing mostly oxygen on said nucleation layer, providing a masking layer over and in contact with the layer of the organic polymer, etching the layer of the organic polymer selectively with respect to the underlying device region and insulating region through a window in a masking layer with said plasma to form an opening exposing a contact area of a device region, depositing tungsten in the opening to form a conductive pillar contacting the contact area, removing the remaining portions of the layer of the organic polymer to thereby expose side surfaces of the pillar, providing a layer of a non-polymeric insulating material to contact and cover the pillar, etching the layer of the insulating material to expose a top surface of the pillar and depositing electrically conductive material to contact the pillar.

8. A method of manufacturing a semiconductor device, which method comprises providing a semiconductor body having adjacent one major surface at least one device region, an insulating gate structure adjacent said major surface and bounding said at least one device region to define at least one insulated gate field effect transistor and an insulating capping layer covering the insulated gate structure so as to encapsulate and thereby electrically insulate the insulated gate structure, and providing an electrical connection to at least the one device region by applying a polyimide to form a layer on the one major surface, forming a masking layer over the polyimide layer, etching the polyimide layer selectively with respect to the underlying at least one device region and the insulating capping layer through a window in the masking layer with a plasma containing mostly oxygen to form an opening exposing a contact area of the at least one device region, depositing tungsten to form within said opening a conductive pillar contacting said contact area, removing the polyimide layer so as to expose side surfaces of said conductive pillar, providing a layer of silicon oxide to cover said conductive pillar, etching the silicon oxide layer to expose a top surface of said pillar and depositing electrically conductive material to contact said conductive pillar.

9. A method according to claim 7 wherein the conductive pillar is formed by depositing a layer of tungsten on said layer of organic polymer and in said opening after formation of said opening, and then etching said tungsten layer to expose said layer of organic polymer while leaving said tungsten layer in said opening thereby forming said conductive pillar.

* * * * *